(12) United States Patent
Allen et al.

(10) Patent No.: US 7,670,437 B2
(45) Date of Patent: Mar. 2, 2010

(54) MASK AND SUBSTRATE ALIGNMENT FOR SOLDER BUMP PROCESS

(75) Inventors: Duane E. Allen, Milton, VT (US); Brian K. Burnor, Fairfax, VT (US); Thomas A. Dotolo, Hinesburg, VT (US); Leonard J. Gardecki, Essex, VT (US); William L. Hammond, Colchester, VT (US); Kibby B. Horsford, Essex, VT (US); Charles R. Ramsey, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/117,061

(22) Filed: May 8, 2008

(65) Prior Publication Data
US 2008/0202421 A1    Aug. 28, 2008

Related U.S. Application Data

(63) Continuation of application No. 10/604,142, filed on Jun. 27, 2003, now Pat. No. 7,410,919.

(51) Int. Cl.
*C23C 16/00* (2006.01)
*C23F 1/00* (2006.01)
*H01L 21/306* (2006.01)

(52) U.S. Cl. ............... 118/729; 118/728; 118/730; 156/345.51; 156/345.54; 156/345.55

(58) Field of Classification Search ........... 118/720, 118/721; 216/12; 250/559.3; 355/53, 75; 356/375, 400; 378/35; 427/468; 430/5
See application file for complete search history.

(56) References Cited

U.S. PATENT DOCUMENTS

| 3,066,053 A | * | 11/1962 | Hunt et al. ............... 438/352 |
| 3,499,714 A | | 3/1970 | Schellenberg |
| 3,516,386 A | | 6/1970 | Schindler et al. |

(Continued)

OTHER PUBLICATIONS

IBM Technical Disclosure Bulletin NN63027. Work Holder and Alignment Device. No Author. Feb. 1, 1963. vol. 5. Issue 9. pp. 7-8.*
IBM Technical Disclosure Bulletin NN63109. Photolithographic Mask Alignment Fixture. No Author. Oct. 1, 1963. vol. 6. Issue 5. pp. 9-10.*

(Continued)

*Primary Examiner*—Parviz Hassanzadeh
*Assistant Examiner*—Tiffany Nuckols
(74) *Attorney, Agent, or Firm*—Schmeiser, Olsen & Watts; Richard M. Kotulak

(57) ABSTRACT

A system for of aligning a mask to a substrate comprising: a fixture for holding the mask and the substrate in fixed positions relative to each other; means for holding the substrate, the means for holding the substrate protruding through openings in a table and the fixture, the means for holding fixedly mounted on a stage, the stage moveable in first and second directions and rotatable about an axis relative to the table; means for affixing the fixture containing the mask and the substrate to the table; means for controlling the means for temporarily affixing so as to generate a uniform force around a perimeter of the fixture to effectuate the temporarily affixing; means for aligning the mask to the substrate, the means for aligning controlling movement of the stage in the first and second directions and rotation about the axis; and means for fastening the fixture together.

21 Claims, 11 Drawing Sheets

U.S. PATENT DOCUMENTS

| | | | |
|---|---|---|---|
| 3,647,533 A | | 3/1972 | Hicks |
| 3,669,060 A | | 6/1972 | Page et al. |
| 4,349,207 A | * | 9/1982 | Fink .................... 279/4.12 |
| 4,357,006 A | * | 11/1982 | Hayes ................... 269/21 |
| 4,544,311 A | | 10/1985 | Husain |
| 4,746,548 A | | 5/1988 | Boudreau et al. |
| 4,755,053 A | | 7/1988 | Levinson et al. |
| 4,818,169 A | * | 4/1989 | Schram et al. ........ 414/331.18 |
| 4,915,057 A | | 4/1990 | Boudreau et al. |
| 5,296,916 A | | 3/1994 | Kelly et al. |
| 5,323,712 A | * | 6/1994 | Kikuiri ................. 108/20 |
| 5,324,012 A | | 6/1994 | Aoyama et al. |
| 5,820,367 A | * | 10/1998 | Osawa .................. 432/253 |
| 6,030,889 A | | 2/2000 | Aulicino et al. |
| 6,198,525 B1 | | 3/2001 | Barringer et al. |
| 6,274,198 B1 | | 8/2001 | Dautartas |
| 6,327,034 B1 | * | 12/2001 | Hoover et al. ........... 356/400 |
| 2001/0030747 A1 | | 10/2001 | Hoover et al. |
| 2002/0113218 A1 | | 8/2002 | Okumura et al. |
| 2002/0139481 A1 | | 10/2002 | Baxter et al. |
| 2006/0235314 A1 | | 10/2006 | Migliuolo et al. |

OTHER PUBLICATIONS

IBM Technical Disclosure Bulletin NN871157. Improved Thermo Mechanical Mask Evaporation Process. No Author. Nov. 1, 1987. vol. 30. Issue 6. pp. 57-58.*

Di Milia et al.; IBM Technical Disclosure Bulletin, Mask/Wafer Locking Device, vol. 21, No. 11, Apr. 1979; pp. 4684-4685.

Christensen et al.; IBM Technical Disclosure Bulletin, Mask Aligning Fixture for Silicon Wafers, vol. 27, No. 4B, Sep. 1984; pp. 2383-2384.

Huntley et al.; IBM Technical Disclosure Bulletin, Kinematic Mounts for Mask Alignment, vol. 21, No. 5, Oct. 1978; pp. 2024-2025.

Wetz; IBM Technical Disclosure Bulletin, Mask-to-Wafer Alignment, vol. 19, No. 6, Nov. 1976; p. 2113.

* cited by examiner

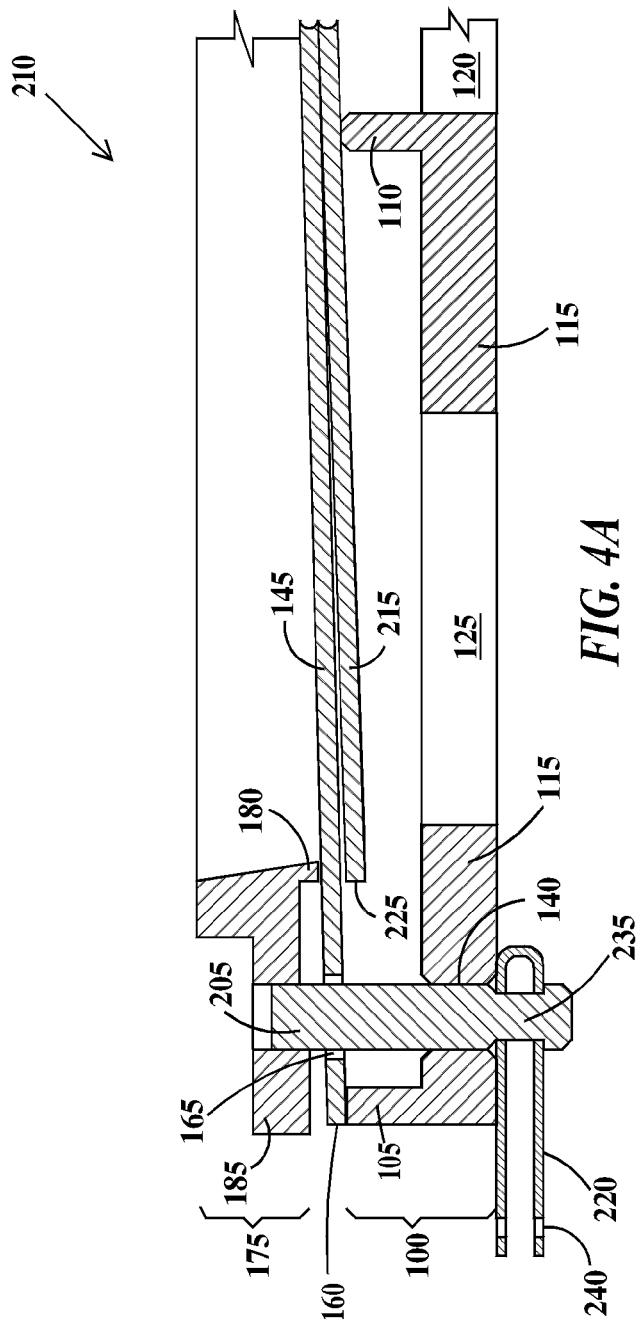
FIG. 4A
FIG. 4B
FIG. 4C

MASK AND SUBSTRATE ALIGNMENT FOR SOLDER BUMP PROCESS

This application is a continuation of U.S. patent application Ser. No. 10/604,142 filed on Jun. 27, 2003. now U.S. Pat. No. 7,410,919issued Aug. 12, 2008.

FIELD OF THE INVENTION

The present invention relates to the field of semiconductor processing; more specifically, it relates to an apparatus and method for aligning a solder bump mask to a substrate.

BACKGROUND OF THE INVENTION

The formation of solder bumps or controlled collapse chip connection (C4) interconnects on semiconductor substrates requires assembly of an alignment fixture holding the substrate and a metal mask having holes through which the solder bump processes of sputter clean, pad limiting metallurgy evaporation and solder bump evaporation are performed. Prior to these process steps, the mask must be aligned to the substrate. Traditionally, alignment of mask to substrate has been done manually, however as solder bump sizes and spacing between solder bumps has decreased; manual alignment has been shown to be unable to provide the alignment accuracy needed.

SUMMARY OF THE INVENTION

A first aspect of the present invention is a system for of aligning a mask to a substrate comprising: an alignment fixture for temporarily holding the mask and the substrate in fixed positions relative to each other; means for holding the substrate by a bottom surface, the means for holding the substrate protruding through an opening in a table and an opening in the alignment fixture, the means for holding fixedly mounted on a stage assembly, the stage assembly moveable in first and second directions and rotatable about an axis relative to the table; means for temporarily affixing the alignment fixture containing the mask and the substrate to the table; means for controlling the means for temporarily affixing so as to generate a uniform force around a perimeter of the alignment fixture to effectuate the temporarily affixing; means for aligning the mask to the substrate, the means for aligning controlling movement of the stage assembly in the first and second directions and rotation about the axis; and means for temporarily fastening the alignment fixture together.

A second aspect of the present invention is a method for of aligning a mask to a substrate comprising in the order recited: (a) placing a bottom ring of an alignment fixture on an alignment tool; (b) loading a substrate onto a chuck; (c) securing the substrate on the chuck; (d) locating alignment targets on the substrate relative to fixed positions of a first X-Y stage and a rotational stage mounted on the first X-Y stage; (e) placing the mask on the bottom ring and placing a top ring of the alignment fixture on the mask, the top ring aligned to the bottom ring; (f) applying a clamping force of a first predetermined amount of force to the alignment fixture sufficient to prevent the mask from moving relative to the top and bottom rings; (g) locating alignment marks on the mask relative to a fixed position of a second X-Y-stage, the first X-Y stage and the table mounted to the second X-Y stage, X and Y orthogonal displacement directions associated with each of the first and second X-Y stages being co-aligned; (h) calculating an X distance in the X direction and a Y distance in the Y direction to move the first X-Y stage and an angle to rotate the rotational stage through in order to align the alignment marks to the alignment targets; (i) increasing the applied clamping force to a second predetermined amount of force, releasing the substrate from the chuck, and increasing the applied clamping force to a third predetermined amount of force; (j) temporarily fastening the alignment fixture containing the mask and the substrate together; and (k) releasing the applied clamping force.

A third aspect of the present invention is a method for of aligning a mask to a substrate comprising in the order recited: (a) providing an alignment fixture for temporarily holding the mask and the substrate in fixed positions relative to each other; (b) providing an alignment tool including a stage assembly and a table; (c) placing a bottom ring of the alignment fixture on the table; (d) securing the substrate on the chuck and locating alignment targets on the substrate relative to a fixed position of the stage assembly; (e) placing the mask on the bottom ring and placing a top ring of the alignment fixture on the mask, the top ring aligned to the bottom ring; (f) applying a affixing force of a first predetermined amount of force to the alignment fixture sufficient to prevent the mask from moving; (g) locating alignment marks on the mask relative to a fixed position of the stage assembly; (h) moving the substrate relative to the mask in order to align the alignment marks to the alignment targets; (i) increasing the applied affixing force to a second predetermined amount of force, releasing the substrate from the chuck, increasing the applied affixing force to a third predetermined amount of force; (j) temporarily fastening the alignment fixture containing the mask and the substrate together; and (k) releasing the applied affixing force.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

FIG. 4A is a partial cross-section view through the assembled substrate to mask alignment fixture for forming interconnects according to the present invention;

FIG. 4B is a top view and FIG. 4C is a side view of a spring clip illustrated in FIG. 4A;

DETAILED DESCRIPTION OF THE INVENTION

For the purposes of the present invention the term interconnect is defined as a solder bump or C4 interconnection that is formed by evaporation onto a substrate through holes formed in a mask. The term substrate is defined to include but is not limited to semiconductor substrates (or wafers) including bulk silicon substrates and silicon-on-insulator (SOI) substrates. The term mask includes but is not limited to metal masks fabricated from molybdenum or other metals. Movement in any of the mutually orthogonal X, Y and Z directions and the rotational Θ direction (as described infra) includes movement in both positive and negative directions.

Figure 1A:
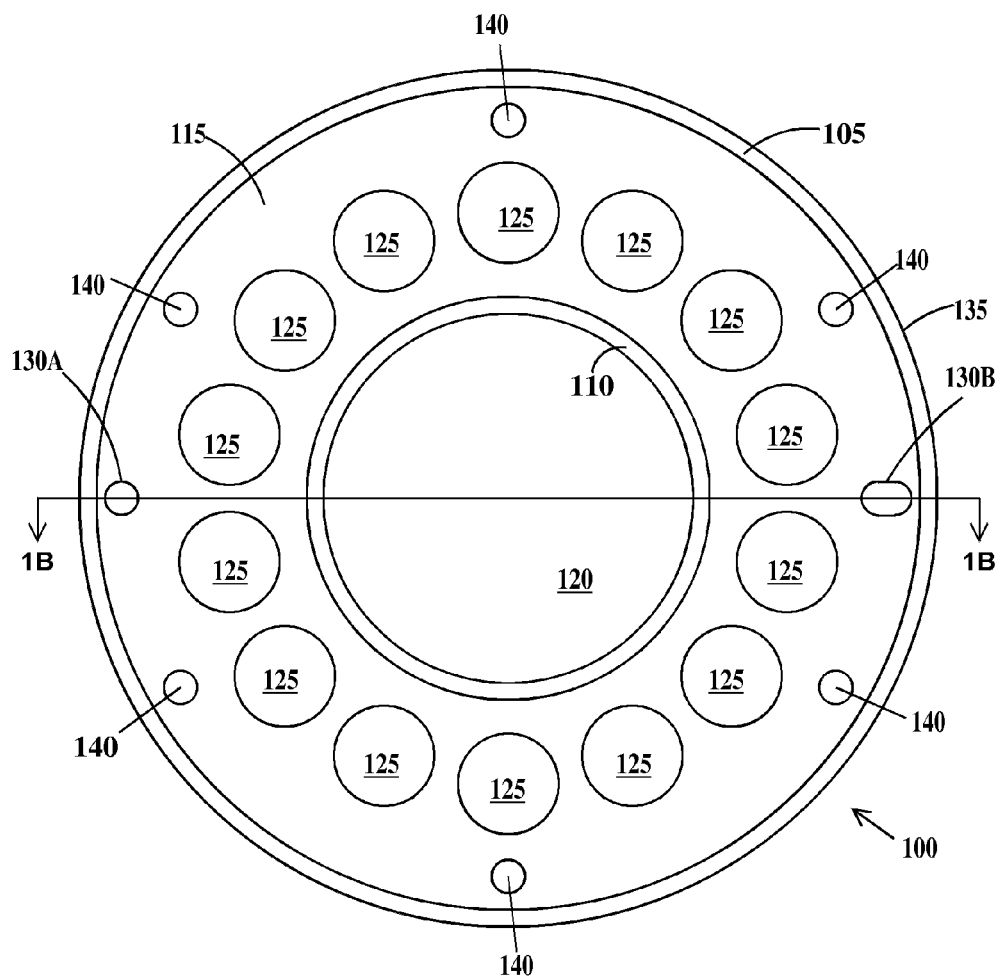
FIG. 1A is a top view of a bottom ring of a substrate to mask alignment fixture for forming interconnects according to the present invention.
Figure 1B:
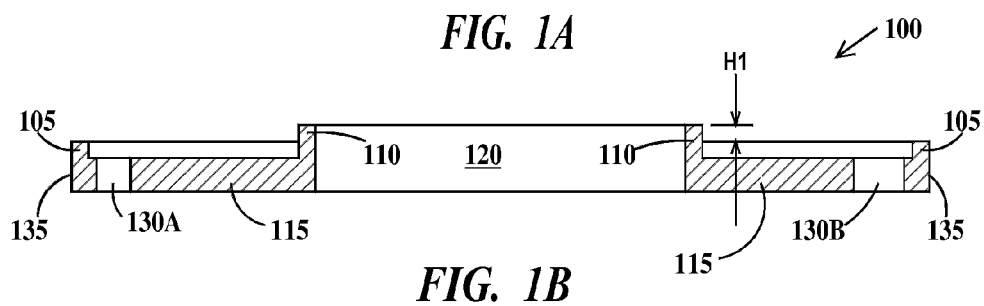
FIG. 1B is a cross-section view through line 1B-1B of FIG. 1A.

FIG. 1A is a top view of a bottom ring 100 of a substrate to mask alignment fixture for forming interconnects according to the present invention and FIG. 1B is a cross-section view through line 1B-1B of FIG. 1A. In FIGS. 1A and 1B, bottom ring 100 includes an outer lip 105 and an inner lip 110 joined by an integral plate 115. Inner lip 110 defines the extent of an opening 120 centered in bottom ring 100. Plate 115 includes a multiplicity of openings 125. Opening 120 provides access for a substrate positioning chuck (see FIG. 6) and openings 125 are for thermal expansion and heat retention control during evaporative processes and to make bottom ring 100 lighter. The difference in height between outer lip 105 and inner lip 110 is H1 In one example, for a standard 200 mm diameter wafer about 650 microns thick, H1 is about 0.007 inches. Bottom ring 100 also includes an alignment pin hole 130A and a diametrically opposed alignment pin slot 130B, each positioned adjacent to an outer perimeter 135 of the bottom ring. Bottom ring 100 further includes a multiplicity (in the present example 6) of retainer post holes 140 evenly spaced about and adjacent to outer perimeter 135 of the bottom ring.

Figure 2:
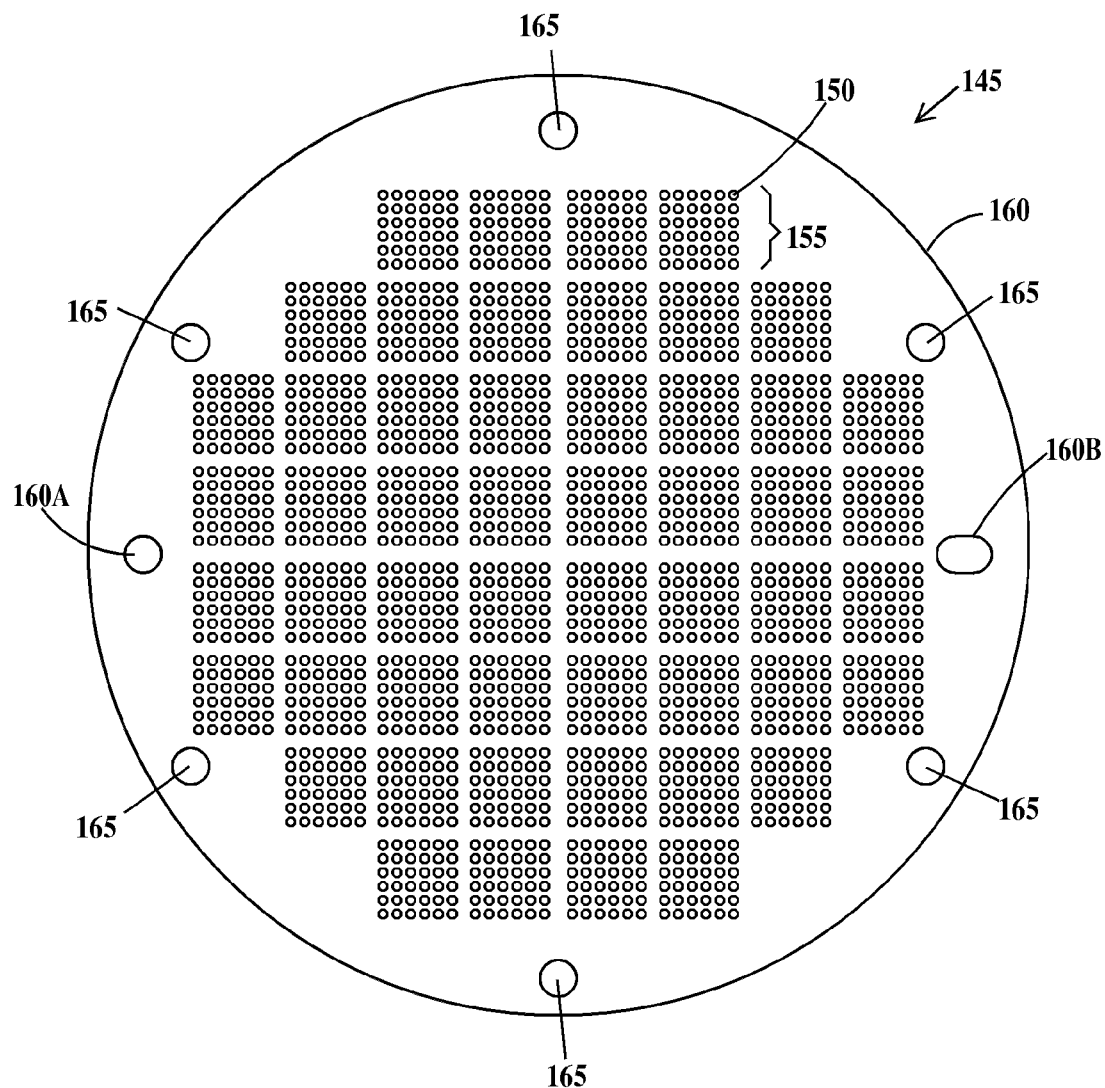
FIG. 2 is a top view of an evaporative mask for forming interconnects according to the present invention.

FIG. 2 is a top view of an evaporative mask for forming interconnects according to the present invention. In FIG. 2, a circular mask 145 includes a multiplicity of openings 150 arranged in groups 155. Each group 155 corresponds to a chip on a substrate (not illustrated) that will be placed under mask 145 as illustrated in FIG. 4 and described infra. Mask 145 also includes an alignment pin hole 160A and a diametrically opposed alignment pin slot 160B, each positioned adjacent to an outer perimeter 160 of the mask. Mask 145 further includes a multiplicity (in the present example 6) of retainer post holes 165 evenly spaced about and adjacent to outer perimeter 160 of the mask.

Figure 3A:
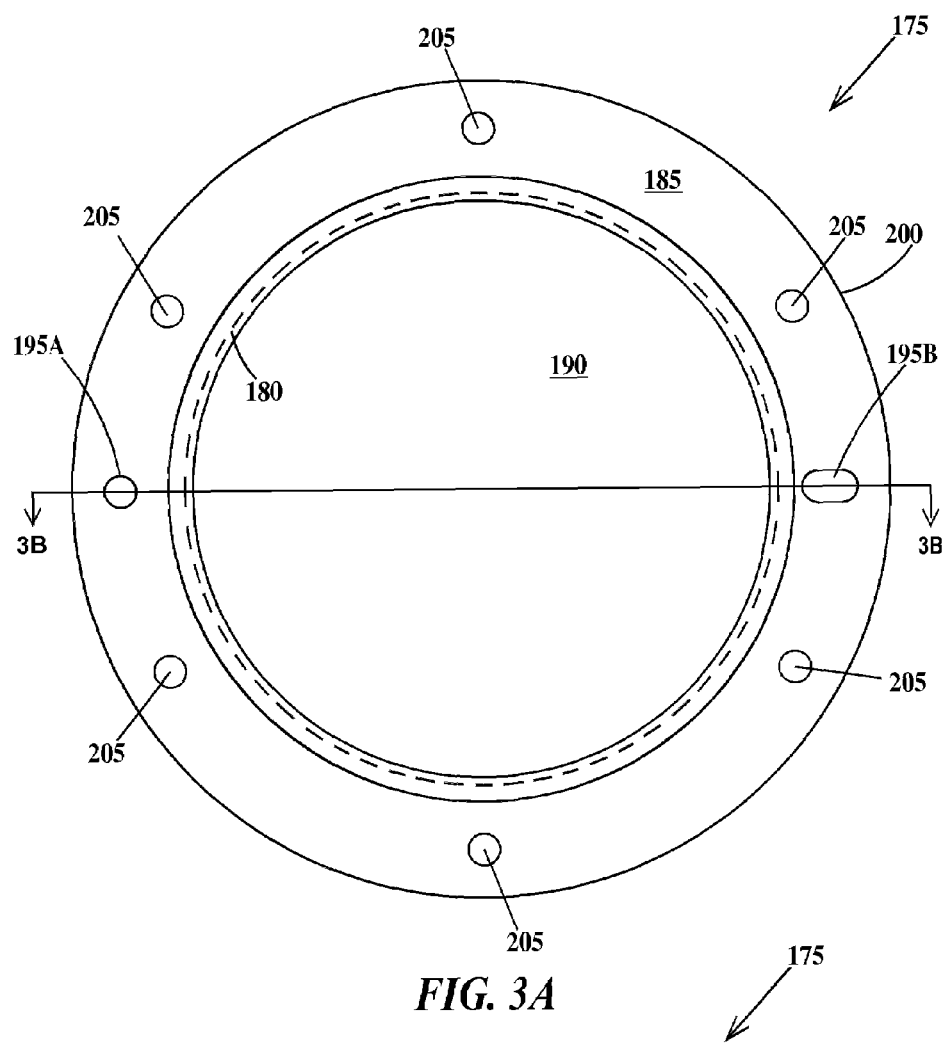
FIG. 3A is a top view of a top ring of the substrate to mask alignment fixture for forming interconnects according to the present invention.
Figure 3B:
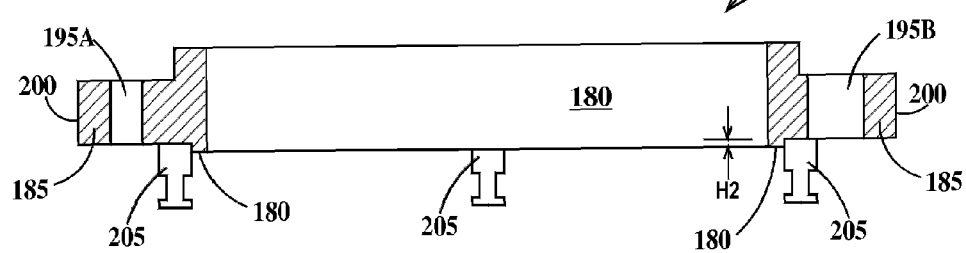
FIG. 3B is a cross-section view through line 3B-3B of FIG. 3A.

FIG. 3A is a top view of a top ring 175 of the substrate to mask alignment fixture for forming interconnects according to the present invention and FIG. 3B is a cross-section view through line 3B-3B of FIG. 3A. In FIGS. 3A and 3B, top ring 175 has a lower lip 180 protruding from a flange 185. Lower lip 180 protrudes a distance H2. In one example, for a standard 200 mm diameter wafer having a thickness of about 725 microns, H2 is about 0.002 inches. Top ring 175 includes an opening 190 centered within top ring 175. Top ring 175 also includes an alignment pin hole 195A and a diametrically opposed alignment pin slot 195B, each positioned adjacent to an outer perimeter 200 of the mask. Top ring 175 further includes a multiplicity (in the present example 6) of retainer posts 205 evenly spaced about and adjacent to outer perimeter 200 of the mask.

FIG. 4A is a partial cross-section view through an assembled substrate to mask alignment fixture 210 for forming interconnects according to the present invention. In FIG. 4A, only a portion of assembled fixture 210 is illustrated. Substrate 215 and mask 145 are illustrated contained in alignment fixture 210. Retainer posts 205 protrude through retainer post holes 140 in bottom ring 100 and pass through retainer post holes 165 in mask 145. When spring clips 220 are slid onto retainer posts 205 perimeter 160 of mask 145 is held in a slightly pressed down position by lower lip 180 of top ring 175 against outer lip 105 of spring clips 220 thus holding substrate 215, mask 145, top ring 175 and bottom ring 100 together. Spring clips 220 are not put in place until mask 145 is aligned to substrate 215.

The combination of the difference in heights between outer and inner lips 105 and 110 of bottom ring 100 and lower lip 180 of top ring 175 deflects (or bows) substrate 215 and mask 140 into very shallow but semi-spherical shape by pressing perimeter 160 of mask 145 and perimeter 225 of substrate 215 towards bottom ring 100.

Since alignment fixture 210 is mounted in a dome of a metal evaporator, the bow imparted to substrate 215 prevents or reduces such problems associated with evaporation through an knife edge opening in a mask such as sputter haze, PLM flaring and solder pad haloing.

FIG. 4B is a top view and FIG. 4C is a side view of spring clip 220 illustrated in FIG. 4A. Spring clip 220 includes a notch 230 that engages a lower end 235 of retainer post 205 as illustrated in FIG. 4A. Spring clip 220 also includes a retraction hole 240 to enable removal of spring clips 205 and thus disassembly of alignment fixture 210 (see FIG. 4A). FIG. 4C illustrates spring clip 220 before engagement with retaining post 205.

Figure 5:
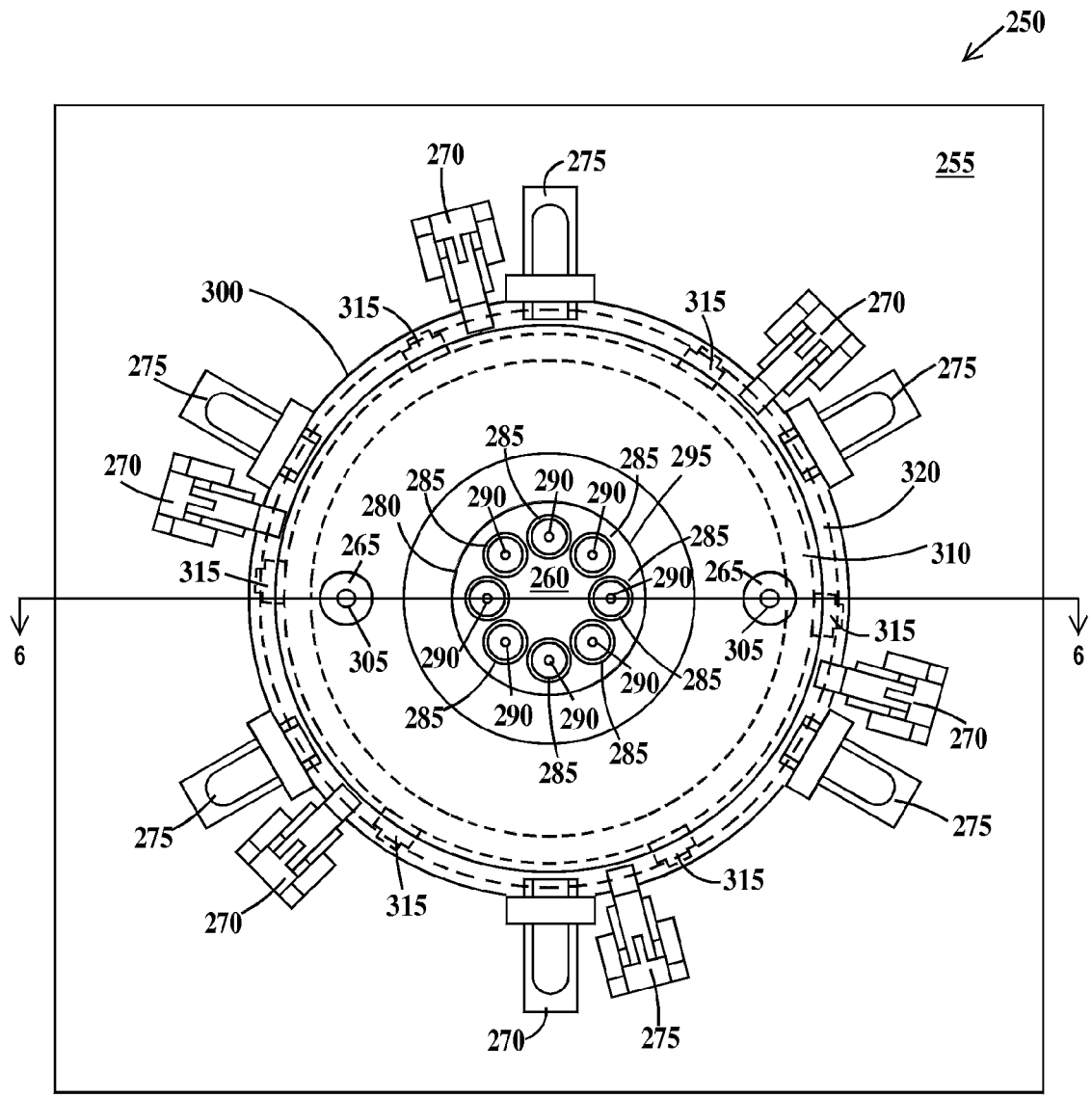
FIG. 5 is a top view of an alignment tool according to the present invention.

FIG. 5 is a top view of an alignment tool 250 according to the present invention. In FIG. 5, alignment tool 250 includes a top plate 255 a chuck 260, alignment pin mechanisms (illustrated in FIG. 8A and described more fully infra), a multiplicity of clamping mechanisms 270 (illustrated in FIG. 9 and described more fully infra) and a multiplicity of clipping mechanisms 275 (illustrated in FIG. 10 and described more fully infra). Chuck 260 extends through an opening 280 in top plate 255 and includes a multiplicity of O-rings 285. Each O-ring surrounds a vacuum port 290 centered within the ring. O-rings 285 are arranged in a ring and located adjacent to a perimeter 295 of chuck 260. Clamping mechanisms 270 are evenly spaced around a locator ring 300 centered on chuck 260 that roughly defines the position occupied by alignment fixture 210. Clipping mechanisms 275 are evenly spaced around locator ring 300. Alignment pin mechanisms (containing alignment pins 305) are positioned diametrically opposed adjacent to and interior of locator ring 300. Attached to an underside of top plate 255 is a fixed inner actuator ring 310 having outwardly protruding spokes 315. Spokes 315 extend through eccentric slots 350 (not shown in FIG. 5, see FIG. 6) in a rotatable outer actuator ring 320. Outer actuator ring 320 can move up and down in the Z direction (see FIG. 6) as well as rotate in the θ direction (see FIG. 6) about an axis defined by the Z direction.

While six clamping mechanisms 270 and six clipping mechanisms 275 are illustrated in FIG. 5, any number greater than or equal to three mechanisms of each type may be used. While two alignment pins mechanisms are illustrated in FIG. 5, a greater number of alignment pin mechanisms may be employed in which case the number and arrangement of alignment pin holes 130A and 195A and alignment pin slots 130B and 195B (see FIGS. 1A and 3A respectively) will change.

While eight O-rings 285 are illustrated in FIG. 5, chuck 260 may include a lesser or greater number of O-rings, the minimum number being three. The inventors have discovered that chucks using a conventional single O-ring design can induce errors up to 10 times greater then the accuracy of the encoders because of O-ring distortion during the alignment process. This distortion is caused by the fact that mask 145 (see FIG. 2) and substrate 215 (see FIG. 4A) are in slight frictional contact that can cause a single O-ring to distort or creep. The radially orientated multi O-ring design of chuck 260 all but eliminates translation errors caused by O-ring creep. Note, a single O-ring design using a hard O-ring, presents other problems such as substrate breakage, since being less flexible there is insufficient compressibility in the O-ring to absorb acceleration induced shock.

Figure 6:
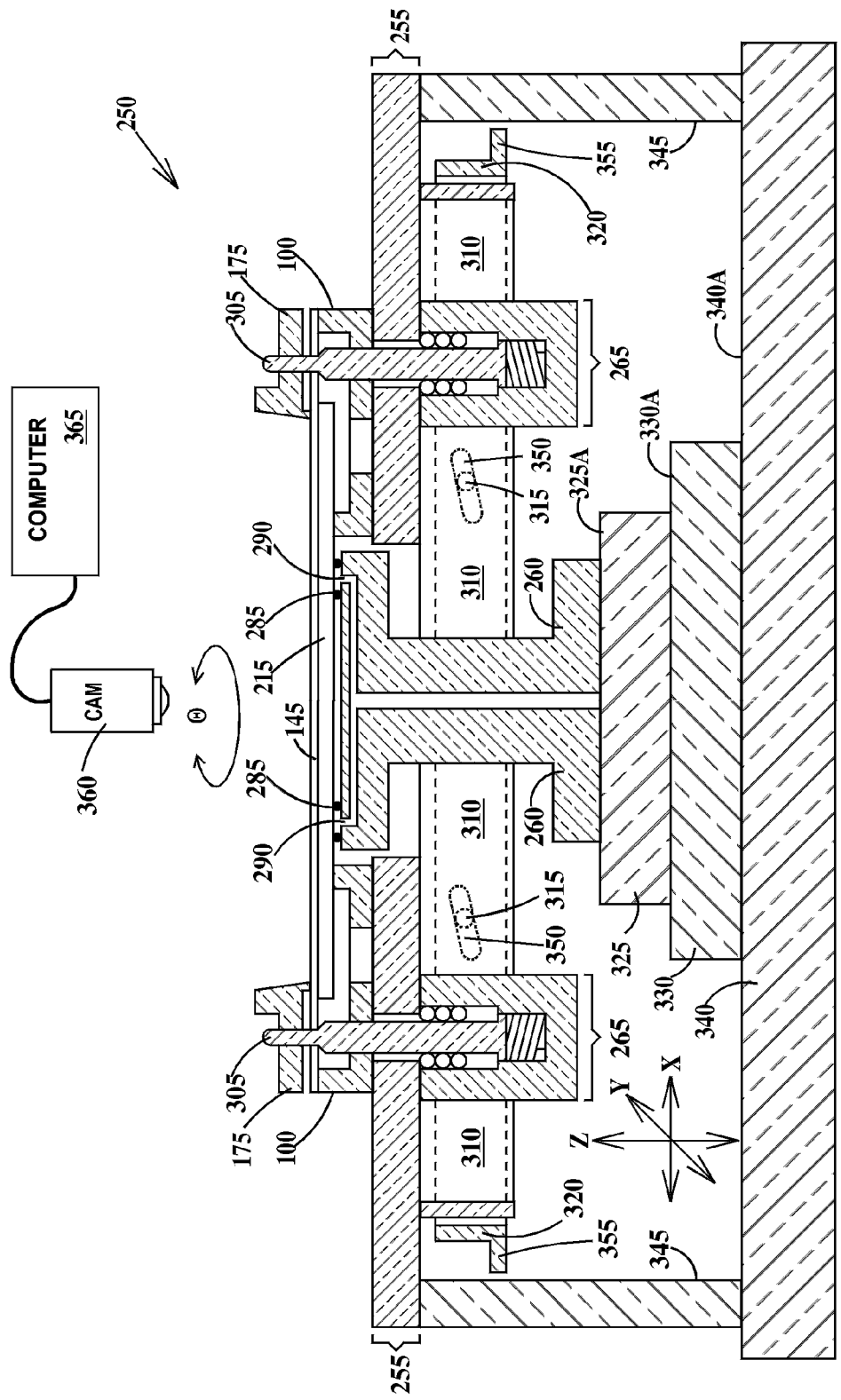
FIG. 6 is a cross-section view through line 6-6 of FIG. 5.

FIG. 6 is a cross-section view through line 6-6 of FIG. 5. In FIG. 6, chuck 260 is mounted on an rotational stage 325 for θ adjustment that in turn is mounted on an upper X-Y stage 330 for X direction and Y direction (the Y direction is into plane of the paper) adjustment of the position of substrate 215. Upper X-Y stage 330 is in turn mounted on a lower X-Y stage 340. It is preferred, but not necessary that the X movement of upper X-Y stage 330 is perpendicular to the Y movement of lower X-Y stage 340, the Y movement of upper X-Y stage 330 is perpendicular to the X movement of lower X-Y stage 340 and the top surfaces 325A, 330A and 340A respectively of rotational stage 325, upper X-Y stage 330 and lower X-Y stage 340 are parallel. Top plate 255 is also mounted on lower X-Y stage 340 via brackets 345. Since alignment pin mechanism 265 is fixed to top plate 255, a measurable and repeatable relationship exists between alignment pins 305 and chuck 260 as long as the relative positions of upper X-Y stage 325 and lower X-Y stage 340 are known.

As outer actuator ring 320 rotates spokes 315 fixed to inner actuator ring 310 and passing through slanted slots 350 in the outer actuator ring cause the outer actuator ring to translate in the Z direction. Note, the X, Y and Z directions are orthogonal to each other. A lip 355 attached to outer actuator ring 320 thus also moves in the Z direction. A push rod of clamping mechanism 270 rides on lip 355 (see FIG. 8) so clamping is controlled by the rotation of outer actuator ring 315 and clamping force is uniformly applied by all clamping mechanisms 275 (see FIG. 5). Alignment tool 250 also includes an optical system 360 (generally a lens and a camera) linked to a computer 365 containing pattern recognition software as well a software for controlling movement rotational stage 325, upper X-Y stage 330 and lower X-Y stage 340. The pattern recognition software detects the position of alignment targets on substrate 215 and alignment marks on mask 145. Computer 365 is linked to stepping motors on rotational stage 325, upper X-Y stage 330 and lower X-Y stage 340 for controlling movement of substrate 215. Computer 365 calculates the amount of upper X-Y stage 330, lower X-Y stage 340 and rotational stage 325 movement required to align mask 145 with the substrate 215.

During the alignment process, it is important that movement of substrate 215 is precise and accurate. In one example, encoders within rotational stage 325 are accurate to 0.001 degree encoders within upper X-Y stage 330 and lower X-Y stage 340 are accurate to 1 micron.

Figure 7:
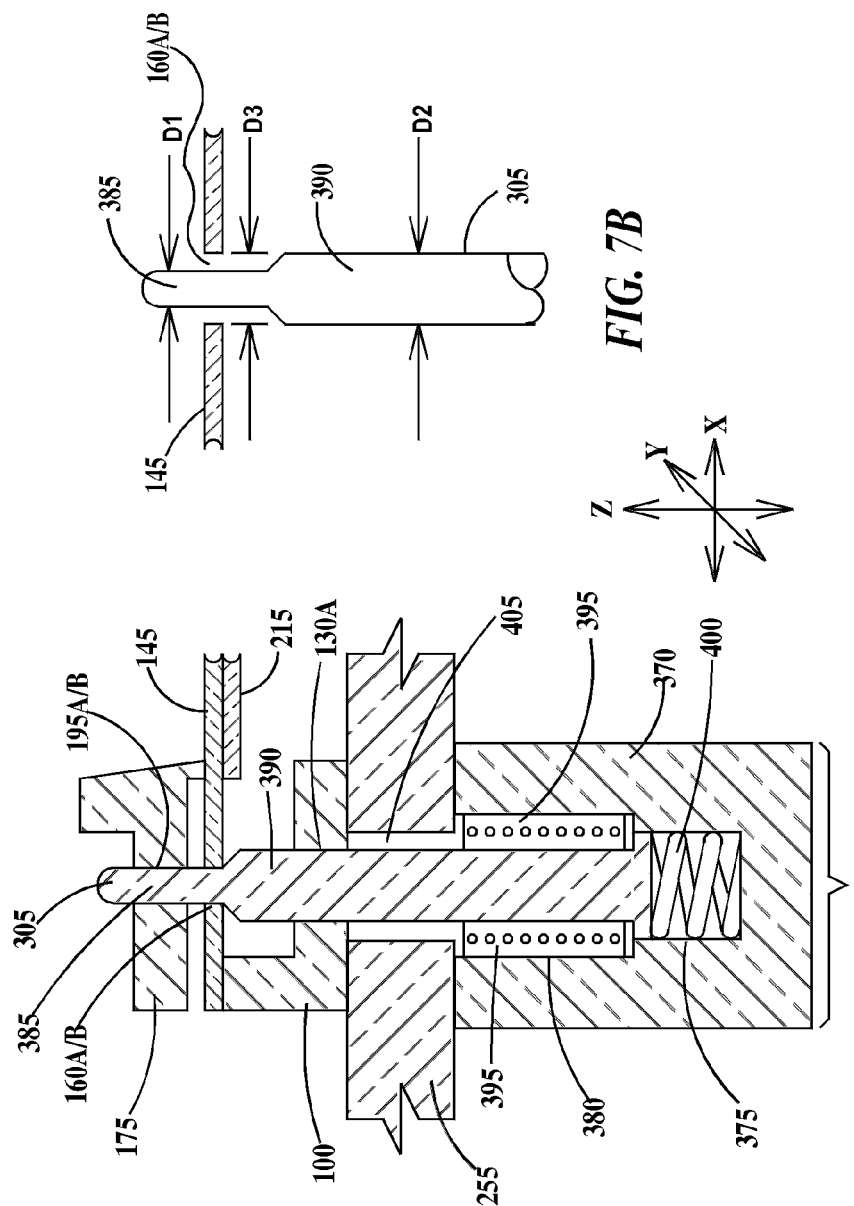
FIG. 7A is a cross-section view through an alignment pin mechanism according to the present invention.
FIG. 7B is a diagram illustrating the tolerances between the alignment pin of FIG. 7A and a mask.

FIG. 7A is a cross-section view through alignment pin mechanism 265 according to the present invention. In FIG. 7, alignment pin mechanism 265 includes a body 370 having a lower chamber 375 open to an upper chamber 380. Alignment pin 305 includes an upper narrow portion 385 and a wide lower portion 390. Alignment pin 305 extends through upper chamber 380 into lower chamber 375. Alignment pin 305 is restricted in movement in the X and Y directions by sleeve bearing 395 and is moveable in the Z direction due to spring 400 contained within lower chamber 375. Lower portion 390 of pin 305 passes through alignment pin hole 130A (or alignment pin slot 130B) in bottom ring 100 as well as an opening 405 in top plate 255. Upper portion 385 of pin 305 passes through alignment pin hole 160A (or alignment pin slot 160B) in mask 145. Upper portion 385 of pin 305 also passes through alignment pin hole 195A (or alignment pin slot 195B) in top ring 175.

FIG. 7B is a diagram illustrating the tolerances between alignment pin 305 of FIG. 7A and mask 145. In FIG. 7B, upper portion 385 of alignment pin 305 has a diameter of D1. Lower portion of alignment pin 305 has diameters D2. Alignment pin hole 160A of mask 145 has a diameter of D3. Note alignment pin slot 160B (see FIG. 2) has a width of D3 and is about 2D3 long. D2 is greater than D1. In one example D2−D1=0.010 inch and D3−D1=0.002 inch.

Returning to FIG. 7A, during alignment of mask 145 to a substrate 215, it is important that the mask does not move. Mask 145 experiences forces in the X, Y and θ directions. Alignment pins 305 restrict this movement. It is also important that alignment pins 305 move freely in the Z direction. Spring 400 ensures that there is always a net upward force (positive Z direction) on alignment pin 305 to resist downward force (negative Z direction) imparted to mask 145 by clamping mechanisms 270 (see FIG. 5) during the alignment process to keep constant contact between the mask and bottom ring 100.

Figure 8:
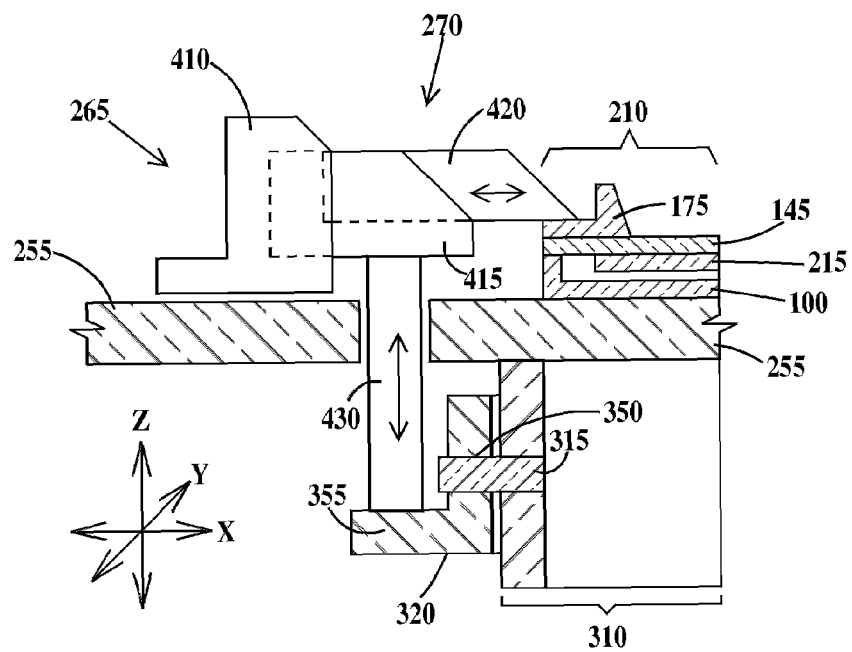
FIG. 8 is a side view of a clamping mechanism according to the present invention.

FIG. 8 is a side view of clamping mechanism 270 according to the present invention. In FIG. 8, clamping mechanism 270 includes a mounting bracket 410 mounted to top plate 255, a body 415, a moveable clamp finger 420 slidably mounted in body 415 and a push rod 430 that operably engages lip 355 of outer actuator ring 320. Clamp finger 420 can be slid over or retracted from top ring 175 by a mechanism not illustrated. As outer actuator ring rotates 320, because spokes 315 are fixed to inner actuator ring 310 and extend through eccentric slots 350, lip 355 moves up or down depending on the direction of rotation of outer actuator ring 320. Push rod 430, engaged on lip 355, moves up and down with lip 355, causing clamp finger 420 to apply pressure to the assembled alignment fixture 210 comprising bottom ring 100, substrate 215, mask 145 and top ring 175. Clamp finger 420 is spring loaded so movement of lip 355 toward top plate 255 works against the spring and moves clamp finger 420 away from alignment fixture 210. As lip 355 lowers, increasing pressure is applied to alignment fixture 210.

Once the alignment process is completed, it is important that the clamping process be uniform across alignment fixture 210, smooth and reproducible time to time. Any non-uniformity will result sideway slippage of mask 145 and/or substrate 215 and thus misalignment after the alignment process. Any non-smoothness in clamping can result in a shock that can cause mask 145 and/or substrate 215 movement, again resulting in misalignment after the alignment process. Non-reproducibility in clamping pressure can result in clipping (see FIG. 9 and discussion infra) problems. Since all clamping mechanisms 270 are driven by outer actuator ring 320 clamping is uniform and smooth. A precision drive mechanism (not shown) driving outer actuator ring 320 ensures reproducible and precision controlled clamping pressure.

Figure 9:
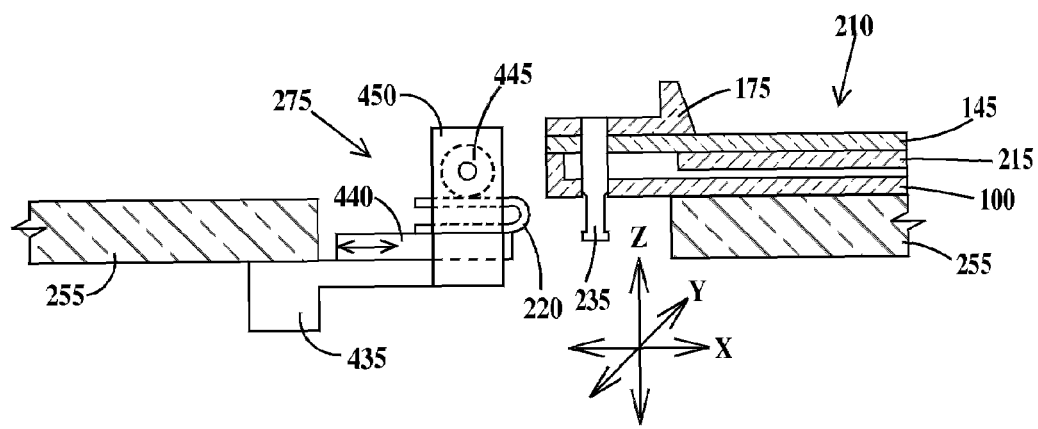
FIG. 9 is a side view of a clipping mechanism, according to the present invention.

FIG. 9 is a side view of clipping mechanism 275 according to the present invention. In FIG. 9, clipping mechanism 275 includes a base 435 mounted to top plate 255, a slide 440 having a slot (not shown) to hold a clip 220, and a roller 445 mounted to a support 450 attached to base 435. In operation, a clip 220 placed on slide 440. As slide 440 is pushed forward toward retaining post 235, clip 220 is compressed by roller 445. As slide 440 continues forward, clip 220 engages retaining post 235 and becomes released from roller 445 allowing clip 220 to "spring" open. When slide 440 is retracted, clip 220 remains in place due to friction forces between the clip and bottom ring 100.

It is important that insertion of clips 220 do move top ring 175 to which retainer posts 235 are fixedly attached. Movement of top ring 175 will cause mask 145 to move, thus changing the alignment of mask 145 to substrate 215. Clipping mechanism 275 "preloads" clips 220 so that forces in the Z direction are eliminated during insertion, resulting in minimal X direction and Y direction forces being applied to retaining post 235 and top ring 175 during insertion. Each slide 440 moved to engage retaining posts 235 simultaneously by a mechanical mechanism.

Figure 10A:
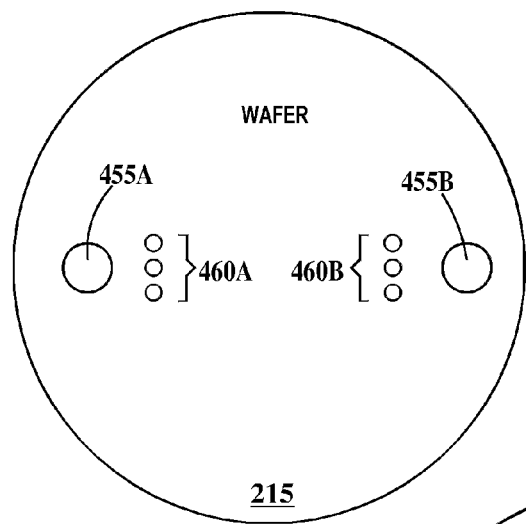
FIG. 10A is a top view of a substrate having alignment marks according to the present invention.

FIG. 10A is a top view of a substrate having alignment marks according to the present invention. In FIG. 10A, substrate 100 includes diametrically opposed (or nearly diametrically opposed) left and right course alignment targets 455A and 455B respectively and diametrically (or nearly diametrically opposed) left and right fine alignment target sets 460A and 460B respectively. Left and right course alignment targets 455A and 455B are used by pattern recognition software residing on computer 365 (see FIG. 6) during alignment operations. Left and right fine alignment targets 460A and 460B are used by an operator to check the quality of alignment operations.

Figure 10B:
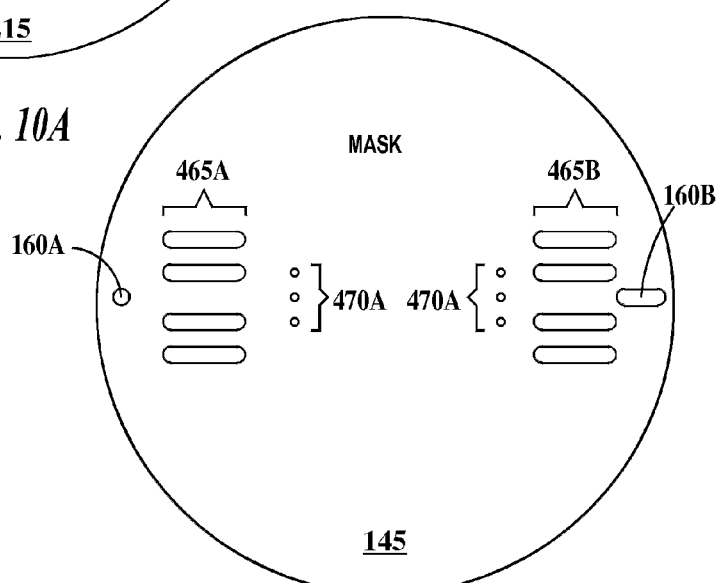
FIG. 10B is a top view of a mask having alignment marks according to the present invention.

FIG. 10B is a top view of a mask having alignment marks according to the present invention. In FIG. 10B, mask 145 includes diametrically opposed (or nearly diametrically opposed) left and right course alignment marks 465A and 465B respectively and diametrically (or nearly diametrically opposed) left and right fine alignment mark sets 470A and 470B respectively. Left and right course alignment targets 465A and 465B are used by pattern recognition software residing on computer 365 (see FIG. 6) during alignment operations. Left and right fine alignment targets 470A and 470B are used by an operator to check the quality of alignment operations. Also illustrated in FIG. 10B are alignment pin hole 160A and alignment pin slot 160B.

Figure 10C:
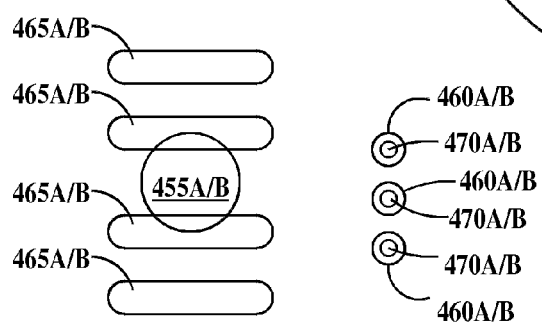
FIG. 10C is a top view of the substrate and mask alignments are they would appear in perfect alignment.

FIG. 10C is a top view of the substrate and mask alignments are they would appear in perfect alignment. In FIG. 10C, course substrate alignment target 455A (455B) is centered on the middle two course mask alignment marks 465A (465B). All mask fine alignment marks 470A (470B) are centered in substrate fine alignment targets 460A (460B).

Figure 11A:
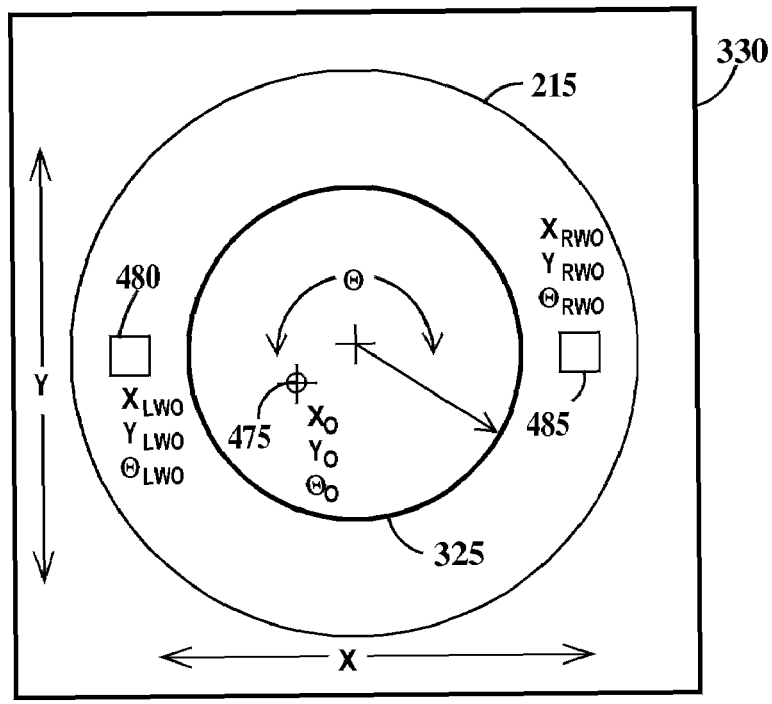
FIG. 11A is a diagram of initial wafer alignment fiducials prior to mask to wafer alignment according to the present invention.

FIG. 11A is a diagram of initial wafer alignment fiducial coordinates prior to mask to wafer alignment according to the present invention. In FIG. 11A, rotational stage in 325 can move the $\Theta$ direction and upper X-Y stage 330 can move in the X and Z direction. A reference location 475 has upper X-Y stage coordinates $X_0$ and $Y_0$ and rotational stage 325 coordinate $\Theta_0$. Rotational stage 325 and upper X-Y stage 330 are initially moved to coordinates $X_0$, $Y_0$ and $\Theta_0$ respectively (as described infra in reference to FIG. 12) and all subsequent motions of rotational stage 325 and upper X-Y stage 330 stage motions are referenced to coordinates $X_0$, $Y_0$ and $\Theta_0$ respectively. Wafer 215 includes a left fiducial mark 480 containing left course alignment target 455A (see FIG. 10A) and fine alignment targets 460A (see FIG. 10A) and a right fiducial mark 485 containing right course alignment target 455B (see FIG. 10A) and fine alignment targets 460B (see FIG. 10A). When rotational stage 325 and upper X-Y stage 330 are moved to coordinates $X_0$, $Y_0$ and $\Theta_0$ respectively, left fiducial 480 is at location $X_{LW0}$, $Y_{LW0}$ and $\Theta_{LW0}$ and right fiducial 485 is at location $X_{RW0}$, $Y_{RW0}$ and $\Theta_{RW0}$.

Figure 11B:
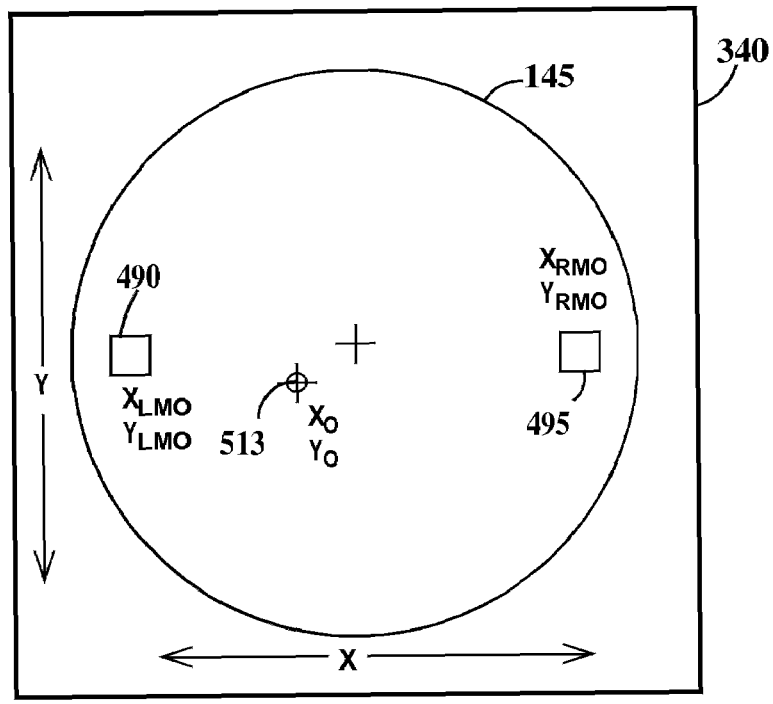
FIG. 11B is a diagram of initial mask alignment fiducials coordinates prior to mask to wafer alignment according to the present invention.

FIG. 11B is a diagram of initial mask alignment fiducial coordinates prior to mask to wafer alignment according to the present invention. In FIG. 11B, lower X-Y stage 340 can move in the X and Z direction. Lower stage X-Y 340 is referenced to reference position 475. All subsequent motions of lower X-Y stage 340 are referenced to coordinates $X_0$ and $Y_0$. As long as the X movement of upper X-Y stage 330 is perpendicular to the Y movement of lower X-Y stage 340, the Y movement of upper X-Y stage 330 is perpendicular to the X movement of lower X-Y stage 340 and the top surfaces of rotational stage 325, upper X-Y stage 330 and lower X-Y stage 340 are parallel. Mask 145 includes a left fiducial mark 490 containing left course alignment mark 465A (see FIG. 10B) and fine alignment marks 470A (see FIG. 10B) and a right fiducial mark 495 containing right course alignment mark 465B (see FIG. 10A) and fine alignment marks 470B (see FIG. 10B). When lower X-Y stage 330 is referenced to coordinates $X_0$ and $Y_0$, left fiducial 490 is at location $X_{LM0}$ and $Y_{LM0}$ and right fiducial 495 is at location $X_{RM0}$ and $Y_{RM0}$.

Figure 12:
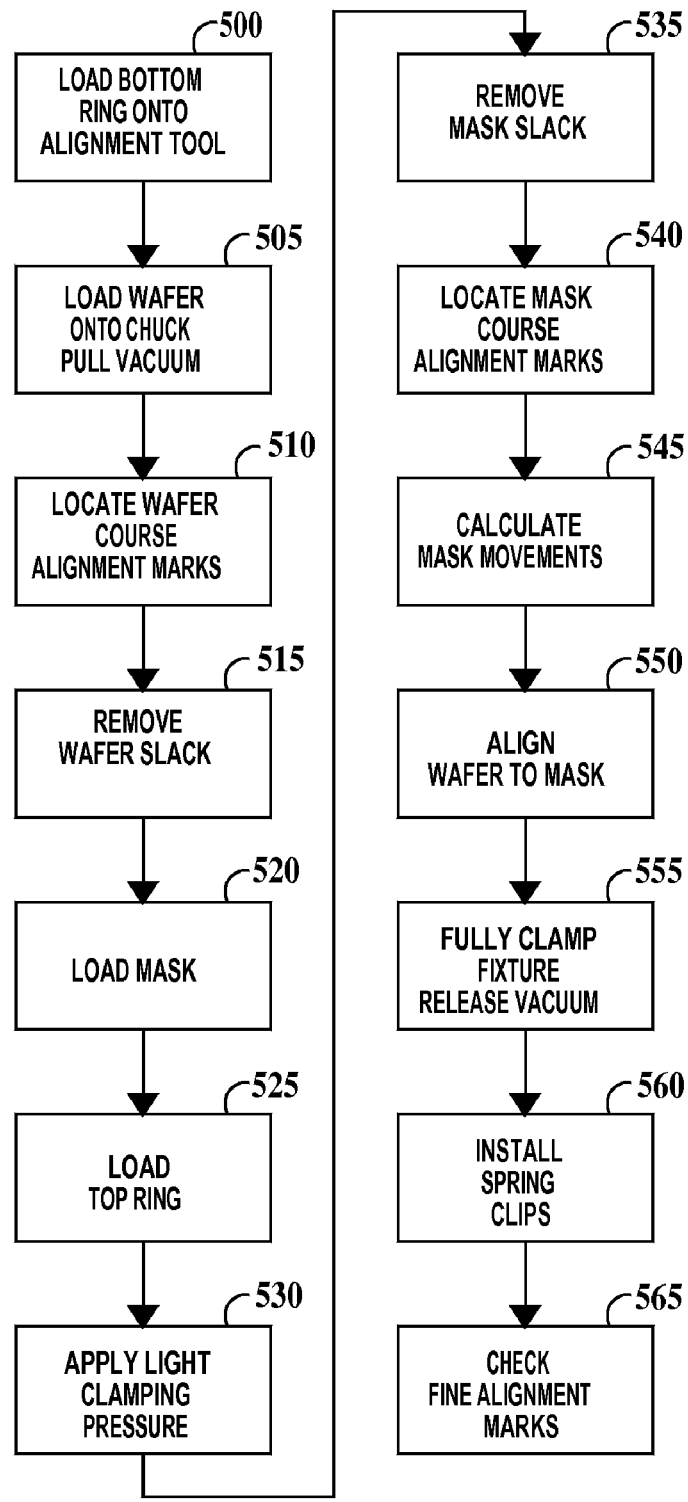
FIG. 12 is a flowchart of the method for aligning a substrate to a mask according to the present invention.

Reference to FIGS. 11A and 11B will be useful in understanding the process illustrated in FIG. 12 and described infra. In FIG. 12 it is assumed that the X movement of upper X-Y stage 330 is perpendicular to the Y movement of lower X-Y stage 340, the Y movement of upper X-Y stage 330 is perpendicular to the X movement of lower X-Y stage 340 and the top surfaces of rotational stage 325, upper X-Y stage 330 and lower X-Y stage 340 are parallel. Any deviations from these conditions, requires more complex calculations then described infra in reference to FIG. 12.

FIG. 12 is a flowchart of the method for aligning a substrate to a mask according to the present invention In step 500, a bottom ring of the alignment fixture is loaded onto the alignment tool and in step 505 a substrate is placed on the chuck of the alignment tool and vacuum applied to the chuck, holding the substrate fast to the chuck.

In step 510, the course substrate alignment targets are located. First, the upper X-Y and rotational stages are moved to a predetermined $X_0$, $Y_0$ and $\theta_0$ positions. For the substrate left course alignment target the pattern recognition software locates the center of the left course alignment target and moves the upper X-Y stage and the rotational stage so the center of the left course alignment target is aligned with the center of the optical system. The pattern recognition software again locates the center of the substrate left course alignment target and moves the upper X-Y stage and the rotational stage so the center of the left course alignment target is aligned with the center of the optical system. The double locating brings the substrate left course alignment target to the area of least distortion within the optical system. This fixes the substrate left course target starting position on the upper X-Y stage and the rotational stage as $X_{LW0}$, $Y_{LW0}$ and $\theta_{LW0}$.

For the substrate right course alignment target the pattern recognition software locates the center of the right course alignment target and moves the upper X-Y stage and the rotational stage so the center of the right course alignment target is aligned with the center of the optical system. The pattern recognition software again locates the center of the substrate right course alignment target and moves on the upper X-Y stage and the rotational stage so the center of the right course alignment target is aligned with the center of the optical system. The double locating brings the substrate right course alignment target to the area of least distortion within the optical system. This fixes the substrate right course target starting position on the upper X-Y stage and the rotational stage as $X_{RW0}$, $Y_{RW0}$ and $\theta_{RW0}$.

Next, in step 515, the upper X-Y stage and the rotational stage are moved fixed distances $D_X$, $D_Y$ and angle $D_\theta$. This motion compensates for the slack that is inherent in the stage mechanics.

In step 520, the mask is positioned (using the alignment pins) over the substrate and in step 525 the top ring of the alignment fixture is positioned (using the alignment pins).

In step 530, a light clamping pressure is applied by the clamping mechanisms in order to prevent motion of the mask during subsequent upper X-Y stage, rotational stage and lower X-Y stage movements. The pressure applied is just sufficient to bring the mask and top ring of the alignment fixture into contact.

In step 535 the upper X-Y stage and the rotational stage are moved a distance $-D_X/2$, $-D_Y/2$ and angle $-D_\theta/2$ (i.e. halfway back to $X_0$, $Y_0$ and $\theta_0$). This motion compensates for the slack that is inherent between the mask and the alignment pins and places the mask in a stable position.

In step 540, the pattern recognition software locates the center of the mask left course alignment mark and moves the lower X-Y stage so the center of the left course alignment mark is aligned with the center of the optical system. The pattern recognition software again locates the center of the mask left course alignment mark and moves the lower X-Y stage so the center of the left course alignment mark is aligned with the center of the optical system. The double locating brings the mask left course alignment mark to the area of least distortion within the optical system. This fixes the left course mark starting position on the lower X-Y stage as $X_{LM0}$ and $Y_{LM0}$.

For the mask right course alignment mark the pattern recognition software locates the center of the right course alignment mark and moves the lower X-Y stage so the center of the right course alignment mark is aligned with the center of the optical system (generally a lens and a camera). The pattern recognition software again locates the center of the mask right course alignment mark and moves the lower X-Y stage so the center of the right course alignment mark is aligned with the center of the optical system. The double locating brings the mask right course alignment mark to the area of least distortion within the optical system. This fixes the right course mark starting position on lower X-Y stage as $X_{RM0}$ and $Y_{RM0}$.

In step 545, first the rotational displacement of the substrate $\theta_W = \tan^{-1}((Y_{LW0}-Y_{RW0})/(X_{LW0}-X_{RW0}))$ and the rotational displacement of the mask $\theta_M = \tan^{-1}((Y_{LM0}-Y_{RM0})/(X_{LM0}-X_{RM0}))$ are calculated. Second, the relative rotational displacement (and correcting theta displacement) between the mask and substrate $\Delta\theta_{MW}=\theta_M-\theta_W$ is calculated. In order to align the substrate to the mask in the X and Y directions compensation for the applied rotation is necessary. Third, the X-translation, $X'=X_{WLO} \cos \Delta\theta_{MW}-Y_{WLO} \sin \Delta\theta_{MW}$ (or $X'=X_{WR0} \cos \Delta\theta_{MW}-Y_{WR0} \sin \Delta\theta_{MW}$) and the Y-translation $Y'=X_{WLO} \sin \Delta\theta_{MW}+Y_{WLO} \cos \Delta\theta_{MW}$ (or $Y_R'=X_{WR0} \sin \theta_{MW}+Y_{WR0} \cos \theta_{MW}$) are calculated. Fourth, the correcting displacements $\Delta Y=Y_{ML0}-Y'$ or $(\Delta Y=Y_{MR0}-Y')$ and $\Delta X=X_{ML0}-X'$ or $(\Delta X=X_{MR0}-X')$ are calculated. Fifth, the $Y_{ALIGN}=\Delta Y+(-D_Y/2)$, $X_{ALIGN}=\Delta X+(-D_X/2)$ and $\theta_{ALIGN}=\Delta\theta_{MW}+(-D_\theta/2)$ movements of the upper X-Y and rotational stages are calculated.

In step 550, the mask and substrate are aligned by moving the upper X-Y stage distances $X_{ALIGN}$ and $Y_{ALIGN}$ and moving the rotational stage angle $\theta_{ALIGN}$.

In step 555, the clamping mechanism fully compresses the top ring, mask and substrate against the bottom ring. The chuck vacuum is released at about 75% full compression in order to avoid breaking the substrate, which is now slightly bowed by the clamping and could be further shocked by air entering the chuck when the substrate releases from the chuck under the condition of the clamping pressure being greater than atmospheric pressure.

In step 560, clipping mechanisms install the clips on the retaining posts which keep the bottom ring, substrate, mask and top ring stack under compression and in alignment.

In step 565, the fine alignment targets/marks are inspected to the alignment of mask to substrate is within specification.

Using the alignment fixture, alignment tool and alignment/clamping/clipping procedure described supra, the inventors have been able to achieve alignments between mask and substrate on 200 mm wafers of better than 20 microns.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A system for aligning a mask to a substrate comprising:
   a removable alignment fixture configured to temporarily hold said mask and said substrate in fixed positions relative to each other, said alignment fixture having a circular top ring and a circular bottom ring;
   a vacuum chuck configured to hold a bottom surface of said substrate to a top surface of said vacuum chuck, said vacuum chuck protruding through an opening in a top plate and an opening in said alignment fixture, said vacuum chuck fixedly mounted on a stage assembly, said stage assembly moveable in first and second directions and rotatable about an axis relative to said top plate, said stage assembly and said top plate mounted to a base;
   three or more clamping mechanisms configured to temporarily affix said alignment fixture containing said mask and said substrate to said top plate by engaging a top surface of said top ring, said three or more clamping mechanisms mounted to said top plate;
   a computer programmed to control said three or more clamping mechanisms and vacuum applied to said vacuum chuck so as to generate a uniform force around a perimeter of said alignment fixture while said alignment fixture is temporarily affixed to said top plate;
   a pattern recognition system comprising a camera, pattern recognition software and said computer, said pattern recognition system configured to align said mask to said substrate, said pattern recognition system configured to control movement of said stage assembly in said first and second directions and rotation about said axis; and
   three or more clipping mechanisms configured to temporarily fasten top and bottom rings of said alignment fixture together with clips that engage retaining posts in said top ring, said three or more clipping mechanisms mounted to said top plate, clips of said three or more clipping mechanisms removable with said alignment fixture.

2. The system of claim 1, wherein said first and second directions are orthogonal to each other and parallel to said top plate.

3. The system of claim 1, wherein said axis is perpendicular to said top plate.

4. The system of claim 1, wherein said base comprises an additional stage assembly moveable in said first and second directions, said stage assembly and said top plate mounted on said additional stage assembly, movement of said additional stage assembly in said first and second directions controlled by said optical recognition system and said computer.

5. The system of claim 1, wherein said vacuum chuck includes a circular array of three or more O-rings adjacent to a perimeter of said chuck, each O-ring of said three or more O-rings extending above a top surface of said chuck and surrounding a respective vacuum port.

6. The system of claim 5, wherein said computer is programmed to release vacuum applied to said vacuum chuck when said uniform force reaches a predetermined value.

7. The system of claim 1, further including at least two mask alignment pin mechanisms, said mask alignment pin mechanisms mounted to said table and containing alignment pins, said alignment pins passing through alignment pin holes in said table and alignment pin holes in said alignment fixture and engaging mask alignment holes in said mask.

8. The system of claim 7, wherein said alignment pins are spring loaded and can move in a third direction perpendicular to said top plate.

9. The system of claim 7, wherein said mask alignment holes comprise a circular alignment hole and a slot.

10. The system of claim 7, wherein said mask alignment holes are diametrically opposed.

11. The system of claim 1, wherein said three or more clamping mechanisms are uniformly spaced around a perimeter of said alignment fixture.

12. The system of claim 1, wherein said three or more clamping mechanisms each further include (i) a clamping finger configured to compress and clamp said alignment fixture to said table and (ii) a push rod configured to move said clamping fingers in a third direction perpendicular to said top plate.

13. The system of claim 12, wherein said push rods are simultaneously activated by a rotatable ring moveable in said third direction as said rotatable ring is rotated.

14. The system of claim 1, wherein said three or more clipping mechanisms are configured to insert removable spring clips onto lower portions of retaining posts extending below said bottom ring of said alignment fixture, said retaining posts fixed in and extending from said top ring of said alignment fixture and through retaining post holes in said mask and retaining post holes in said bottom ring.

15. The system of claim 14, wherein three or more clipping mechanisms are configured to compress said removable spring clips prior to insertion of said removable spring clips onto said retaining posts.

16. The system of claim 1, wherein said pattern recognition system includes a camera and a computer, said pattern recognition system configured to determine locations of center points of alignment targets on said substrate and alignment marks on said mask relative to a fixed position of said stage assembly and configured to calculate a distance to move said stage assembly in said first direction, a distance to move said stage assembly in said second direction, and a angle to rotate said stage assembly through in order to align said center points of said alignment targets with said center points of said alignment marks.

17. The system of claim 1, wherein said alignment fixture comprises:
said top ring and said bottom ring;
said bottom ring having an inner lip for supporting an interior region of said substrate and an outer lip for supporting a peripheral region of said mask, said inner lip higher than said outer lip;
retaining posts fixed in and extending from said top ring and through retaining post holes in said bottom ring;
removable spring clips engaging said retaining posts;
wherein said top ring presses said peripheral portion of said mask against said outer lip when said alignment fixture is assembled.

18. The system of claim 1, wherein said computer is programmed to control (i) vacuum pressure to said vacuum chuck, (ii) operation of said three or more means clamping mechanisms, and (iii)operation of said three or more clamping mechanisms.

19. The system of claim 1, wherein said mask is a metal mask.

20. The system of claim 1, wherein said substrate is a semiconductor wafer.

21. The system of claim 1, wherein said mask is a solder bump evaporation mask.

* * * * *